(12) United States Patent
Pan et al.

(10) Patent No.: US 8,124,473 B2
(45) Date of Patent: Feb. 28, 2012

(54) STRAIN ENHANCED SEMICONDUCTOR DEVICES AND METHODS FOR THEIR FABRICATION

(75) Inventors: James N. Pan, West Jordan, UT (US);
Sey-Ping Sun, Poughkeepsie, NY (US);
Andrew M. Waite, Radebeul/Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 874 days.

(21) Appl. No.: 11/734,673

(22) Filed: Apr. 12, 2007

(65) Prior Publication Data
US 2008/0251851 A1 Oct. 16, 2008

(51) Int. Cl.
*H01L 21/336* (2006.01)
*H01L 21/8238* (2006.01)
*H01L 21/44* (2006.01)

(52) U.S. Cl. ........ 438/233; 438/300; 438/667; 438/674; 438/938; 257/E21.632; 257/E29.193

(58) Field of Classification Search .................. 438/199, 438/300, 938, 233, 667, 674; 257/E21.632, 257/E29.193
See application file for complete search history.

(56) References Cited

U.S. PATENT DOCUMENTS

| | | | |
|---|---|---|---|
| 4,692,349 A | 9/1987 | Georgiou et al. | |
| 6,180,469 B1 | 1/2001 | Pramanick et al. | |
| 7,329,582 B1* | 2/2008 | Pan et al. ...................... | 438/300 |
| 2002/0132413 A1 | 9/2002 | Chang et al. | |
| 2005/0212058 A1* | 9/2005 | Huang et al. .................. | 257/384 |
| 2006/0220113 A1 | 10/2006 | Tamura et al. | |
| 2006/0281288 A1* | 12/2006 | Kawamura et al. ........... | 438/592 |
| 2006/0286736 A1* | 12/2006 | Orlowski et al. .............. | 438/199 |
| 2006/0289856 A1* | 12/2006 | Shimamune et al. ........... | 257/19 |
| 2007/0114611 A1* | 5/2007 | Chidambarrao et al. ..... | 257/355 |
| 2007/0190730 A1* | 8/2007 | Huang et al. .................. | 438/299 |
| 2008/0157224 A1* | 7/2008 | Fischer et al. ................ | 257/401 |
| 2008/0160688 A1* | 7/2008 | Pan .............................. | 438/250 |

FOREIGN PATENT DOCUMENTS

| | | |
|---|---|---|
| EP | 0 813 234 A2 | 12/1997 |
| JP | 2006261283 A | 9/2006 |
| WO | 2007112228 A1 | 10/2007 |

OTHER PUBLICATIONS

Pan J, et al: "Novel approach to reduce source/drain series resistance in high performance CMOS devices using self-aligned CoWP process for 45nm node UTSOI transistors with 20nm gate length" 2006 Symposium on VLSI Technology. Digest of Technical Papers, IEEE 2006, 2 Pgs.
PCT International Search Report for Application No. PCT/US2008/004692 mailed Nov. 4, 2008.
German Office Action for Application No. 11 2008 000 974.0 dated Oct. 28, 2010.

* cited by examiner

*Primary Examiner* — Kevin Parendo
(74) *Attorney, Agent, or Firm* — Ingrassia Fisher & Lorenz, P.C.

(57) ABSTRACT

A strain enhanced semiconductor device and methods for its fabrication are provided. One method comprises embedding a strain inducing semiconductor material in the source and drain regions of the device to induce a strain in the device channel. Thin metal silicide contacts are formed to the source and drain regions so as not to relieve the induced strain. A layer of conductive material is selectively deposited in contact with the thin metal silicide contacts, and metallized contacts are formed to the conductive material.

13 Claims, 6 Drawing Sheets

STRAIN ENHANCED SEMICONDUCTOR DEVICES AND METHODS FOR THEIR FABRICATION

TECHNICAL FIELD

The present invention generally relates to strain enhanced semiconductor devices and to methods for their fabrication, and more particularly relates to semiconductor devices having strain inducing embedded regions and to methods for fabricating such devices without causing the strain to be relieved.

BACKGROUND

The majority of present day integrated circuits (ICs) are implemented by using a plurality of interconnected field effect transistors (FETs), also called metal oxide semiconductor field effect transistors (MOSFETs), or simply MOS transistors. A FET includes a gate electrode as a control electrode and spaced apart source and drain electrodes between which a current can flow. A control voltage applied to the gate electrode controls the flow of current through a channel between the source and drain electrodes.

An important parameter associated with MOS transistors is the device resistance ("on resistance") from source to drain when the device is turned on. The total on resistance is the sum of the channel resistance plus the external resistance. The channel resistance is a function of the mobility of majority carriers in the device channel; other parameters being equal, the higher the mobility, the lower the channel resistance. The external resistance includes a number of components including but not limited to the resistance through each of the source and drain regions and the contact resistance to the source and drain regions. It is known to enhance the mobility of majority carriers by applying a strain to the channel region. A compressive longitudinal strain enhances the mobility of majority carrier holes in the channel of a P-channel MOS (PMOS) transistor and a tensile longitudinal strain enhances the mobility of majority carrier electrons in the channel of an N-channel MOS (NMOS) transistor. Such channel strains can be induced by embedding a strain inducing monocrystalline material into the source and drain regions of the transistor. It is also known to reduce the external resistance including the resistance through the source and drain regions and the contact resistance to the source and drain regions by forming a metal silicide layer contacting the source and drain regions. Unfortunately, the formation of a metal silicide layer on the source and drain regions has the side effect of causing a relaxation of the strain on the channel region caused by the embedded material. Siliciding the source and drain regions to reduce the external resistance thus may negate the possible reduction in channel resistance achieved by embedding a strain inducing material.

Accordingly, it is desirable to provide a strain enhanced semiconductor device having an optimized total on resistance. In addition, it is desirable to provide methods for fabricating a strain enhanced semiconductor device having low on resistance. Furthermore, other desirable features and characteristics of the present invention will become apparent from the subsequent detailed description and the appended claims, taken in conjunction with the accompanying drawings and the foregoing technical field and background.

BRIEF SUMMARY

In accordance with one embodiment a strain enhanced semiconductor device having a source region and a drain region separated by a strained channel region is provided. The device includes a gate electrode overlying the strained channel region and thin metal silicide contacts to the source and drain regions. An electro-less plated conductive layer overlies the thin silicide contacts and a stressed insulating layer overlies the gate electrode.

In accordance with a further embodiment, a method is provided for fabricating a strain enhanced semiconductor device. A strain inducing semiconductor material is embedded in the source and drain regions of the device to induce a strain in the device channel. Thin metal silicide contacts are formed to the source and drain regions so as not to relieve the induced strain. A layer of conductive material is selectively deposited in contact with the thin metal silicide contacts, and metallized contacts are formed to the conductive material.

BRIEF DESCRIPTION OF THE DRAWINGS

The present invention will hereinafter be described in conjunction with the following drawing figures, wherein like numerals denote like elements, and wherein.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

FIGS. 1-16 illustrate a stressed MOS device 30 and method steps for manufacturing such an MOS device in accordance with various embodiments. In these illustrative embodiments stressed MOS device 30 is a complementary MOS (CMOS) device here illustrated by a single NMOS transistor 31 and a single PMOS transistor 33. As will become clear from the following description, the various embodiments are directed to the fabrication of an NMOS transistor having enhanced mobility and/or a PMOS transistor that also has enhanced mobility to achieve a semiconductor device having superior on resistance characteristics. Those of skill in the art will recognize that the invention can be applied to a CMOS device, a single channel NMOS device, or to single channel PMOS device. An integrated circuit formed from stressed MOS devices fabricated in accordance with an embodiment can include a large number of devices such as device 30, and may also include both stressed and unstressed PMOS transistors and stressed and unstressed NMOS transistors.

Various steps in the manufacture of MOS transistors are well known and so, in the interest of brevity, many conventional steps will only be mentioned briefly herein or will be omitted entirely without providing the well known process details. Although the term "MOS device" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over a semiconductor substrate.

Figure 1:
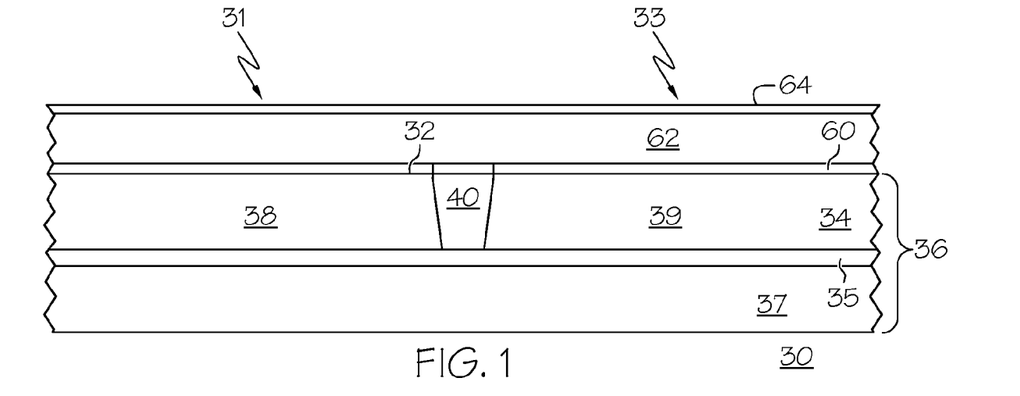
FIGS. 1-10 illustrate, in cross section, a strain enhanced MOS device and methods for its fabrication in accordance with various embodiments.

As illustrated in cross section in FIG. 1, the fabrication of stressed MOS device 30, in accordance with an embodiment, begins with providing a semiconductor substrate 36 having a surface 32. The semiconductor substrate can be any monocrystalline semiconductor material, but is preferably a monocrystalline silicon substrate wherein the terms "silicon substrate" and "silicon layer" will be used herein to encompass the relatively pure silicon materials typically used in the semiconductor industry. Semiconductor substrate 36 will herein be referred to, for ease of discussion but without limitation, as a silicon substrate. Those of skill in the art will recognize that semiconductor substrate 36 can also be formed of other semiconductor materials such as, for example, silicon germanium (SiGe), silicon carbon (SiC), gallium arsenide, or the like. Silicon substrate 36 may be a bulk silicon wafer (not illustrated) or a thin layer of silicon 34 on an insulating layer 35 (commonly know as silicon-on-insulator or SOI) that, in turn, is supported by a silicon carrier wafer 37. Preferably semiconductor substrate 36 is, as here illustrated, without limitation, an SOI wafer. Whether formed of monocrystalline silicon or some other monocrystalline semiconductor material, the monocrystalline material forming substrate 36 and specifically thin layer 34, if the substrate is an SOI substrate, will be characterized by a lattice constant associated with the crystalline structure of that material.

To fabricate a CMOS device, portions of thin silicon layer 34 will be doped with P-type impurity dopants (a P-well 38) for the fabrication of N-channel MOS transistors 31 and other portions will be doped with N-type impurity dopants (an N-well 39) for the fabrication of P-channel MOS transistors 33. The P-well and N-well can be doped to the appropriate conductivity, for example, by ion implantation. Shallow trench isolation (STI) 40 or other electrical isolation is formed in the semiconductor substrate and preferably extends through thin layer of silicon 34 to insulating layer 35 to electrically isolate individual devices as required by the circuit function being implemented. As is well known, there are many processes that can be used to form the STI, so the process need not be described here in detail. In general, STI includes a shallow trench that is etched into the surface of the semiconductor substrate and that is subsequently filled with an insulating material. After the trench is filled with the insulating material the surface is usually planarized, for example by chemical mechanical planarization (CMP).

With reference again to FIG. 1, a layer of gate insulator 60 is formed at the surface of thin silicon layer 34. The gate insulator may be thermally grown silicon dioxide formed by heating the silicon substrate in an oxidizing ambient, or may be a deposited insulator such as a silicon oxide, silicon nitride, a high dielectric constant insulator such as $Hf_xSi_yO_z$, or the like. Deposited insulators can be deposited, for example, by chemical vapor deposition (CVD), low pressure chemical vapor deposition (LPCVD), or plasma enhanced chemical vapor deposition (PECVD). As illustrated in FIG. 1, gate insulator 60 is a thermally grown silicon dioxide that grows only at the surface of the silicon layer. The gate insulator material is typically 1-10 nanometers (nm) in thickness. In some applications it may be advantageous to deposit the gate insulator, especially if the semiconductor substrate is a semiconductor material other than silicon. In accordance with one embodiment a layer of gate electrode forming material 62 such as polycrystalline silicon is deposited onto the layer of gate insulator. For ease of discussion, but without limitation, the layer of gate electrode forming material will hereinafter be referred to as a polycrystalline silicon layer although those of skill in the art will understand that metals or other conductive materials could also be used. The layer of polycrystalline silicon is preferably deposited as undoped polycrystalline silicon and is subsequently impurity doped by ion implantation. The polycrystalline silicon material can be deposited, for example, to a thickness of about 100-120 nm by LPCVD by the hydrogen reduction of silane. A layer 64 of hard mask material such as silicon oxide, silicon nitride, or silicon oxynitride is deposited onto the surface of the polycrystalline silicon. The hard mask material can be deposited to a thickness of about 50 nm, also by LPCVD.

Figure 2:
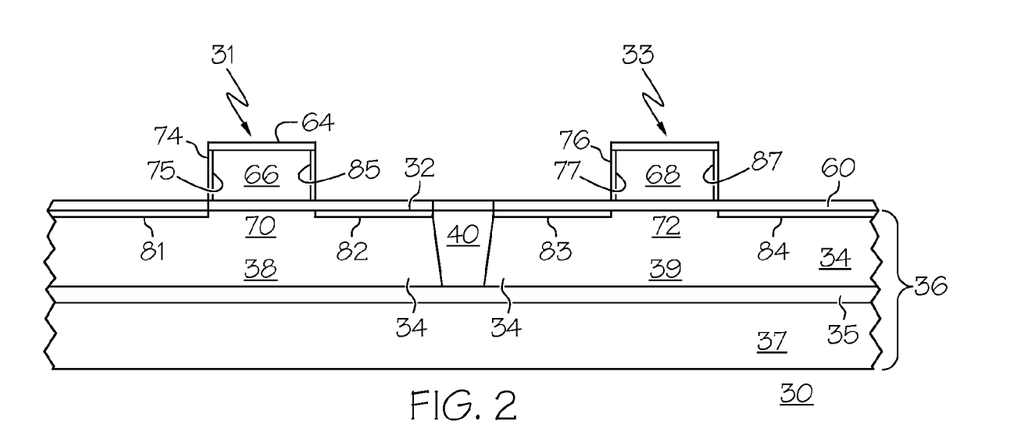

The layer of polycrystalline silicon 62 and the layer of hard mask material 64 are photolithographically patterned to form MOS transistor gate electrodes 66 and 68 as illustrated in cross section in FIG. 2. Gate electrode 66 overlies the portion of P-well 38 of thin silicon layer 34 that will form a channel 70 of NMOS transistor 31 at surface 32. In similar manner gate electrode 68 overlies the portion of N-well 39 that will form a channel 72 of PMOS transistor 33, also at surface 32. The polycrystalline silicon can be etched in the desired pattern by, for example, plasma etching in a Cl or $HBr/O_2$ chemistry and the hard mask can be etched, for example, by plasma etching in a $CHF_3$, $CF_4$, or $SF_6$ chemistry. Following the patterning of the gate electrode, in accordance with one embodiment, a thin layer 74 of silicon oxide is thermally grown on the opposing sidewalls 75 and 85 of gate electrode 66 and a thin layer 76 of silicon oxide is thermally grown on the opposing sidewalls 77 and 87 of gate electrode 68 by heating the polycrystalline silicon gate electrodes in an oxidizing ambient. Layers 74 and 76 can be grown to a thickness of about 2-5 nm. Gate electrodes 66 and 68 and layers 74 and 76 are used as ion implantation masks to form source 81 and drain 82 extensions of NMOS transistor 31 and source 83 and drain 84 extensions of PMOS transistor 33. The source and drain extensions of NMOS transistor 31 can be formed by the implantation of arsenic ions, and the source and drain extension of PMOS transistor 33 can be formed by the implantation of boron ions. The possible need for and method of forming source and drain extensions are well known and hence need not be explained in detail herein. As is well known, although not illustrated, a layer of patterned photoresist can be used to mask the P-well region during implantation of the source and drain extensions of the PMOS transistor and another layer of patterned photoresist can be used to mask the N-well region during implantation of the source and drain extensions of the NMOS transistor.

Figure 3:
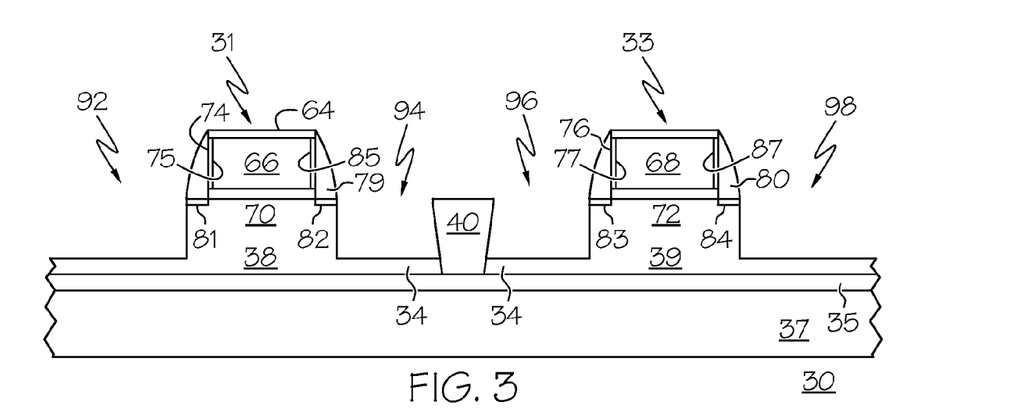

In accordance with one embodiment, as illustrated in FIG. 3, sidewall spacers 79 are formed overlying thin oxide layer 74 on opposing sidewalls 75, 85 and sidewall spacers 80 are formed overlying thin oxide layer 76 on opposing sidewalls 77, 87 of gate electrodes 66 and 68, respectively. The sidewall spacers can be formed of an insulating material such as silicon nitride, silicon oxide, or the like by depositing a layer of the insulating material over the gate electrodes and subsequently anisotropically etching the layer, for example by reactive ion etching (RIE) using a $CHF_3$, $CF_4$, or $SF_6$ chemistry. Sidewall spacers 79 and 80, gate electrodes 66 and 68, the hard mask on the top of the gate electrodes, and STI 40 are used as an etch mask to etch recesses or trenches 92 and 94 in the silicon substrate in spaced apart self alignment with the opposing edges of N-channel gate electrode 66 and to etch recesses 96 and 98 in spaced apart self alignment with the opposing edges of P-channel gate electrode 68. The recesses extend through the source and drain extensions and intersect the ends of channels 70 and 72. The recesses can be anisotropically etched, for example by reactive ion etching using an $HBr/O_2$ or Cl chemistry. If stressed MOS device 30 is being formed on an SOI substrate, the recesses are etched into thin silicon layer 34, but do not extend through the entire thickness of the layer. At least a thin portion of layer 34 is left at the bottom of the recesses to act as a nucleating site for a subsequent epitaxial growth step.

Figure 4:
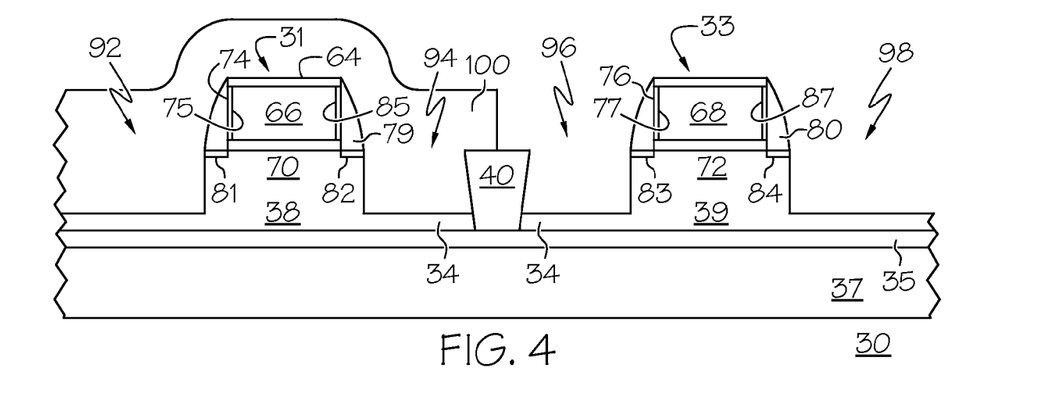

The method in accordance with one embodiment continues by depositing and patterning a masking layer 100 such as a layer of silicon oxide, as illustrated in FIG. 4. The masking layer can be deposited, for example, to a thickness of about 50 nm by LPCVD from a tetraethylorthosilicate (TEOS) source. Masking layer 100 is patterned, for example by using conventional photoresist patterning and etching steps, to remove the layer from PMOS transistor 33 while retaining the layer overlying NMOS transistor 31.

Figure 5:
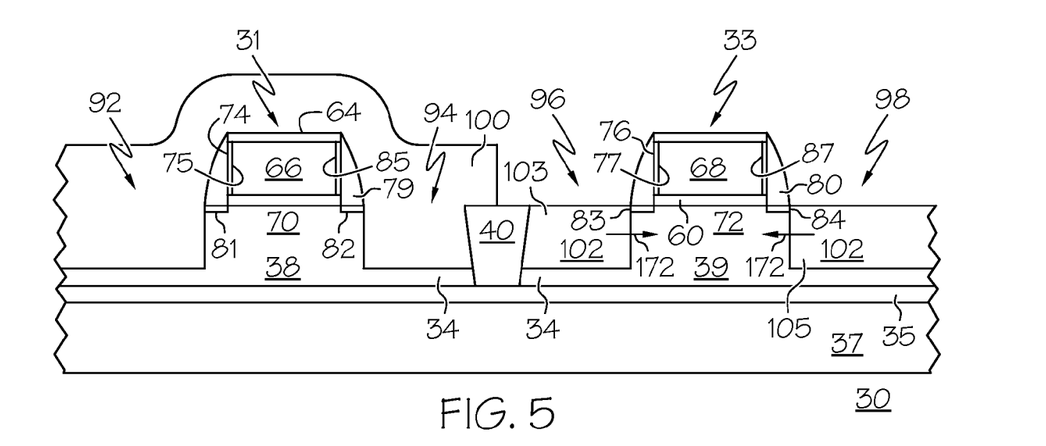

As illustrated in FIG. 5, the method in accordance with this embodiment continues by filling recesses 96 and 98 with a monocrystalline semiconductor material 102 having a lattice constant greater than the lattice constant of the host thin silicon layer 34. Preferably semiconductor material 102 is selectively grown embedded epitaxial silicon germanium (SiGe) having about 10-25 atomic percent germanium with the germanium replacing silicon at crystal lattice sites. Epitaxial growth of the embedded semiconductor material is nucleated on the remaining thin portion of silicon layer 34 at the bottoms of recesses 96 and 98. Masking material 100, sidewall spacers 80, hard mask material 64 and STI 40 retard the selective growth in regions other than recesses 96 and 98. Methods for epitaxially growing materials such as SiGe on a silicon host in a selective manner are will known and need not be described herein. SiGe has a greater lattice constant than silicon and creates a compressive longitudinal strain on transistor channel 72 as indicated by arrows 172. The compressive longitudinal stress increases the mobility of majority carrier holes in the channel and hence improves the performance of P-channel MOS transistor 33. The SiGe can be impurity doped with P-type conductivity determining impurities such as boron to form source 103 and drain 105 regions electrically coupled to source 83 and drain 84 extensions of PMOS transistor 33. The impurity doping can be accomplished by in situ doping during the selective epitaxial growth or subsequently by ion implantation.

Figure 6:
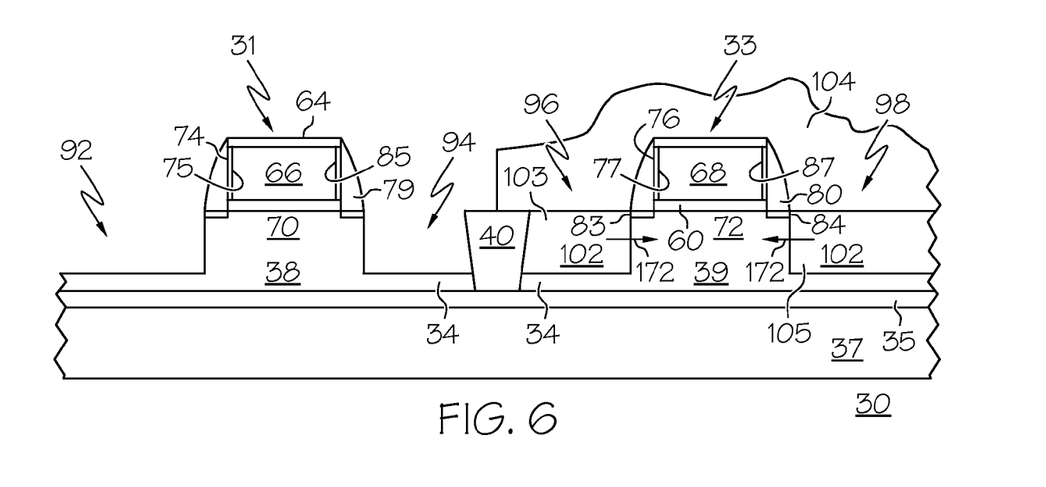
Figure 7:
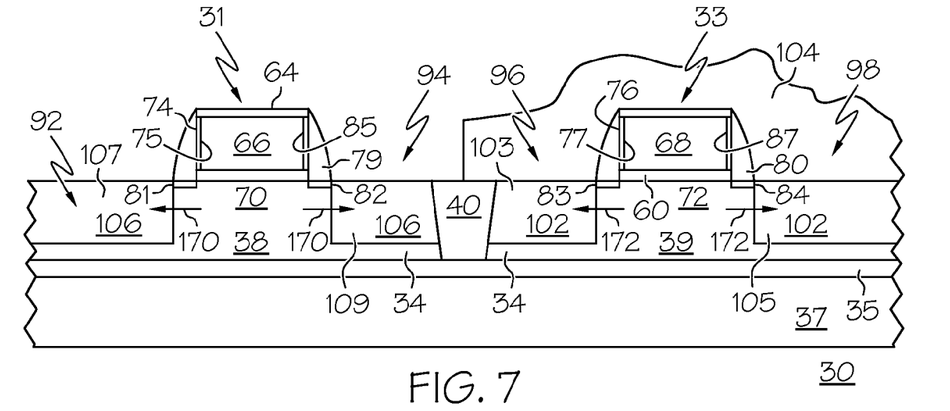

The steps illustrated in FIGS. 4 and 5 for stressing the channel of PMOS transistor 33 can be repeated, with appropriate changes, for enhancing the mobility of majority carrier electrons in channel 70 of NMOS transistor 31 as illustrated in FIGS. 6 and 7. Patterned masking layer 100 is removed and, as illustrated in FIG. 6, a masking layer 104 is deposited and patterned to remove the layer from NMOS transistor 31 while retaining the layer overlying PMOS transistor 33. Layer 104 can be of similar composition to masking layer 100 and can be deposited and patterned in like manner.

As illustrated in FIG. 7, the method in accordance with this embodiment continues by filling recesses 92 and 94 with a monocrystalline semiconductor material 106 having a lattice constant less than the lattice constant of the host thin silicon layer 34. Preferably semiconductor material 106 is selectively grown embedded epitaxial silicon carbon (SiC) having about 1-4 atomic percent of carbon with the carbon replacing silicon at crystal lattice sites. Epitaxial growth of the embedded semiconductor material is nucleated on the remaining thin portion of silicon layer 34 at the bottoms of recesses 92 and 94. Masking material 104, sidewall spacers 79, hard mask material 64 and STI 40 retard the selective growth in regions other than recesses 92 and 94. Methods for epitaxially growing materials such as SiC on a silicon host in a selective manner are will known and need not be described herein. SiC has a smaller lattice constant than silicon and creates a tensile longitudinal stress in transistor channel 70 as indicated by arrows 170. The tensile longitudinal stress increases the mobility of majority carrier electrons in the channel and hence improves the performance of NMOS transistor 31. The SiC can be impurity doped with N-type conductivity determining impurities such as arsenic or phosphorous to form source 107 and drain 109 regions electrically coupled to source 81 and drain 82 extensions of NMOS transistor 31. The impurity doping can be accomplished by in situ doping during the selective epitaxial growth or subsequently by ion implantation. Those of skill in the art will understand that the method steps illustrated in FIGS. 6 and 7 also can be carried out before the method steps illustrated in FIGS. 4 and 5.

Figure 8:
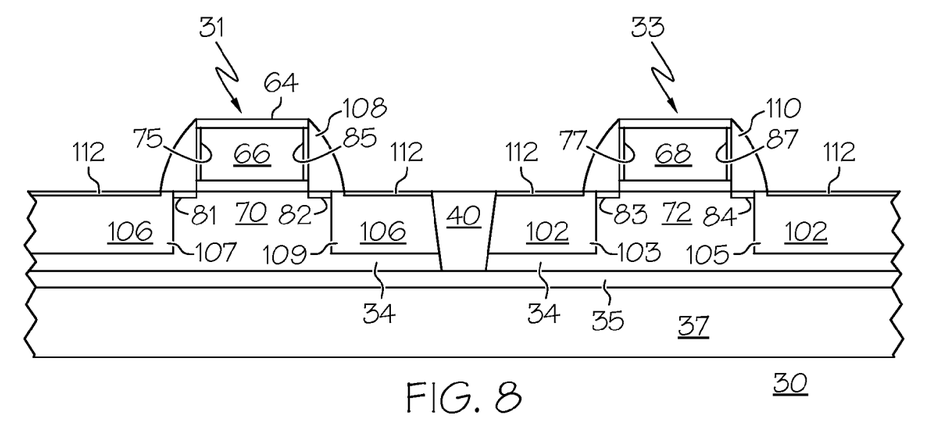

In accordance with one embodiment the method continues by removing masking layer 104 and sidewall spacers 79 and 80. The layer of hard mask material 64 can also be partially or totally removed at this time, although in this exemplary embodiment the hard mask is not removed. In accordance with this embodiment new sidewall spacers 108 are formed on opposing sidewalls 75 and 85 of gate electrode 66 and new sidewall spacers 110 are formed on opposing sidewalls 77 and 87 of gate electrode 68 as illustrated in FIG. 8. The new sidewall spacers can be formed, for example, by depositing a layer of insulating material such as silicon oxide, silicon nitride, or the like by PECVD or LPCVD and by anisotropically etching the layer, for example by reactive ion etching. In conventional processing a thick metal silicide layer would now be formed at the surface of and extending into the bulk of the source and drain regions. The thick silicide was thought necessary to decrease the external resistance of the transistors by decreasing the resistance across the source and drain regions and by decreasing the contact resistance to the source and drain regions. Unfortunately it has been found that the formation of thick metal silicide layers causes a relaxation of the stresses imposed on the channel regions by the embedded SiGe and/or SiC thus reducing the mobility enhancement otherwise gained by embedding the material. The problems attendant with thick metal silicide layers are overcome, in accordance with an embodiment of the invention, by instead forming a thin metal silicide layer 112 in contact with the source and drain regions and possibly in contact with some of the gate electrodes (as needed to implement the desired circuit function) if and where the hard mask layer has been removed. By "thin metal silicide layer" or "thin metal silicide contact" is meant a layer of metal silicide extending into the source and drain regions to a depth of about 5 nm or less. The thin metal silicide layer is formed by depositing a layer of silicide forming metal (not illustrated) and reacting the metal with exposed silicon (SiGe and/or SiC in the source and drain regions and possibly polycrystalline silicon gate electrodes) by heating, for example by rapid thermal annealing (RTA). The silicide forming metal can be, for example, cobalt, nickel, rhenium, ruthenium, or palladium, or alloys of those metals, and preferably is either cobalt or nickel. The silicide forming metal can be deposited, for example, by sputtering to a thickness of about 5-30 nm. By using a thin layer of silicide forming metal, silicide layer 112 forms only to a depth of less than about 5 nm in the source and drain regions. It has been found that such thin metal silicide layers have a negligible effect on reducing the strain inducing effect of the embedded epitaxial material. Any silicide forming metal that is not in contact with exposed silicon, for example the silicide forming metal that is deposited on the sidewall spacers or on STI 40, does not react during the RTA to form a silicide and may subsequently be removed by wet etching in a $H_2O_2/H_2SO_4$ or $HNO_3/HCl$ solution.

Figure 9:
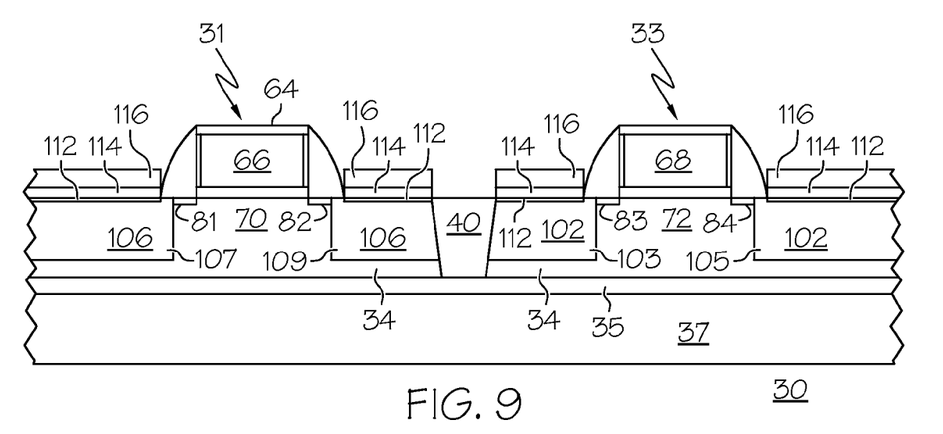

Because the metal silicide layer is thin, it is difficult to make reliable electrical contact to the source and drain regions with only a conventional contact plug technology. In the conventional contact plug technology (not illustrated) a layer of dielectric material such as a CVD silicon oxide would be deposited over the metal silicide and the gate electrode structure. The dielectric material could be planarized by a chemical mechanical planarization (CMP) technique and then contact opening would be etched through the dielectric material to expose a portion of the metal silicide. A contact layer such as a layer of titanium would be deposited through the contact openings and onto the surface of the metal silicide formed on the source and drain regions. The deposition of titanium would be followed by formation of a conductive barrier layer such as a titanium nitride layer and then a tungsten plug. Heating the Ti/TiN/W contact plug structure would cause the formation of a thick titanium silicide layer that could relax the stress in the embedded source and drain regions. Additionally, the TiN layer can have a relatively high sheet resistance especially in small contact openings. In accordance with an embodiment of the present method the problem associated with the conventional contact plug technology is avoided by selectively depositing a layer of conductive material in contact with thin metal silicide layers 112. Preferably a thin seed layer 114 is selectively deposited on thin metal silicide layers 112 and then thicker layers 116 of metal or other conductive materials are selectively deposited on the seed layer as illustrated in FIG. 9. Seed layer 114 can be, for example, a layer of palladium having a thickness ranging from one monolayer to about 3 nm. The layer of palladium is preferably deposited by electro-less deposition from a solution of palladium acetate and acetic acid. Preferably conductive material layer 116 selectively deposited onto the seed layer is a cobalt and tungsten metal layer. Boron and/or phosphorus may also be added to layer 116 to improve uniformity and selectivity of deposition and durability. Thicker layer 116 is preferably selectively deposited by electro-less deposition from a solution such as a solution of cobalt sulphate heptahydrate, ammonium tungstate, and sodium hypophosphite with the possible addition of buffering agents, complexing agents and pH balancers. Chemicals such as dimethylamine borane can be added as a source of boron. Other electro-less deposition solutions for this application, some proprietary, are available from the vendors of electro-less deposition equipment. Using such a solution, thicker metal layer 116 can be selectively deposited onto seed layer 114 to a thickness of about 20-50 nm in about 15-40 minutes with a solution temperature from about 65° C. to about 75° C. Exact deposition times and temperatures depend on the particular deposition solution and the particular deposition equipment that is used. In a preferred method seed layer 114 is preferably palladium deposited by an electro-less deposition process and thicker layer 116 is a metal layer including at least cobalt and tungsten, but although these materials and processes are preferred, the inventive method is not limited to these materials or to an electro-less deposition process. Other conductive materials and other selective deposition techniques can also be used. For example, the thicker layers can be pure tungsten deposited by a selective CVD technique.

Figure 10:
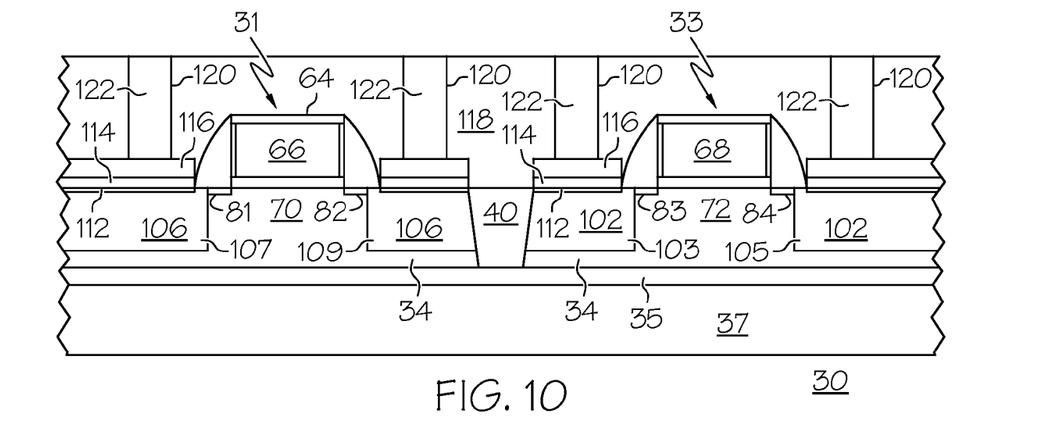

In accordance with one embodiment the method continues in conventional manner, as illustrated in FIG. 10, by the deposition of an insulating layer 118. Insulating layer 118, often referred to as an inner layer dielectric (ILD) can be, for example, a layer of silicon oxide deposited by one of the chemical vapor deposition techniques. The surface of insulating layer 118 is preferably planarized, for example by CMP, and contact openings 120 are etched through the planarized layer to expose portions of thicker deposited conductive layer 116 over the source and drain regions. Contact openings 120 are filled with metal 122 such as aluminum or copper or alloys thereof or by other conductive material such as doped polycrystalline silicon to form contacts to the conductive metal layer and in turn to the source and drain regions. These method steps for forming and patterning ILD layers and filling contact openings are well known to those of skill in the art of fabricating semiconductor devices and need not be described in detail. Although not illustrated, further layers of interlayer dielectric material, additional layers of interconnect metallization, and the like may also be applied and patterned to achiever the proper circuit function of the integrated circuit being implemented.

Figure 11:
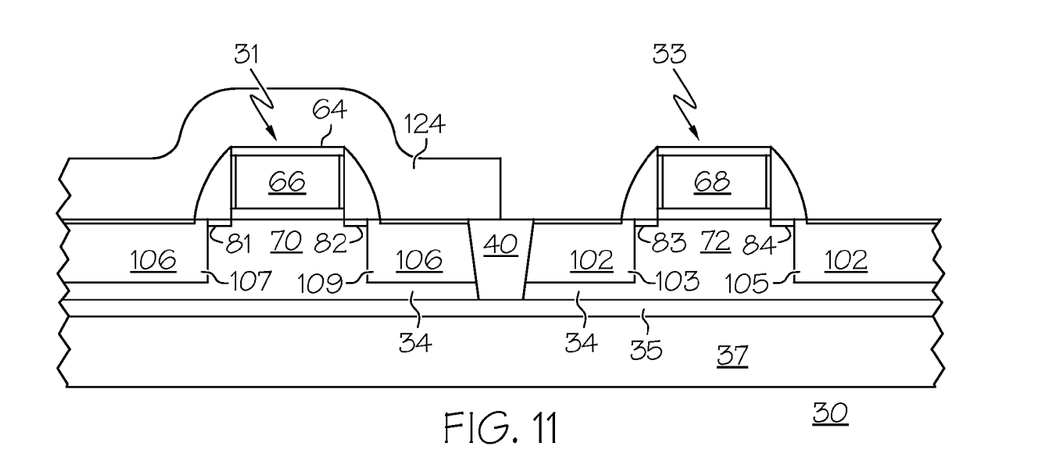
FIGS. 11-14, taken together with FIGS. 1-8, illustrate, in cross section, a strain enhanced MOS device and methods for its fabrication in accordance with alternate embodiments.

In accordance with an alternate embodiment the method for fabricating a strain enhanced MOS device 30 begins by carrying out the same method steps as illustrated in FIGS. 1-8. Following the formation of thin metal silicide layer 112 (FIG. 8), a layer of insulating material 124 is deposited and patterned as illustrated in FIG. 11. The layer of insulating material can be, for example, a layer of silicon oxide deposited by a CVD process from a TEOS source. The layer of insulating material can be patterned by conventional photoresist patterning and etching steps. The patterned insulating material is removed from PMOS transistor 33 and is retained overlying NMOS transistor 31.

Figure 12:
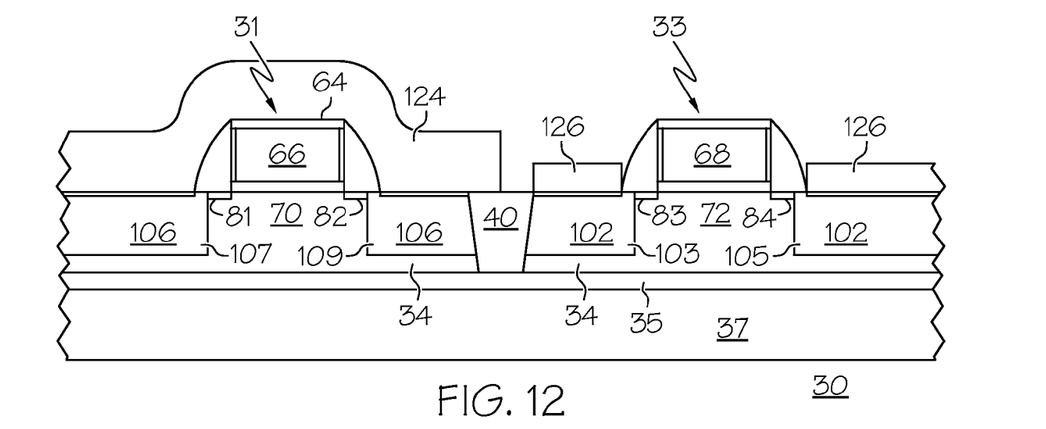

As illustrated in FIG. 12, this embodiment continues by the selective deposition of a compressive stressed conductive metal nitride layer 126 in electrical contact with the metal silicide layer on source region 103 and drain region 105 of PMOS transistor 33. The conductive metal nitride can be, for example, a nitride of titanium, vanadium, cobalt, or nickel. The conductive metal nitride can be deposited, for example, by an electro-less deposition process. The deposition parameters can be adjusted so that the nitride is deposited as a compressive stressed layer. For example, the deposition temperature and reactant composition can be appropriately adjusted. Additionally, a post deposition UV anneal can be implemented to adjust the stress condition.

Figure 13:
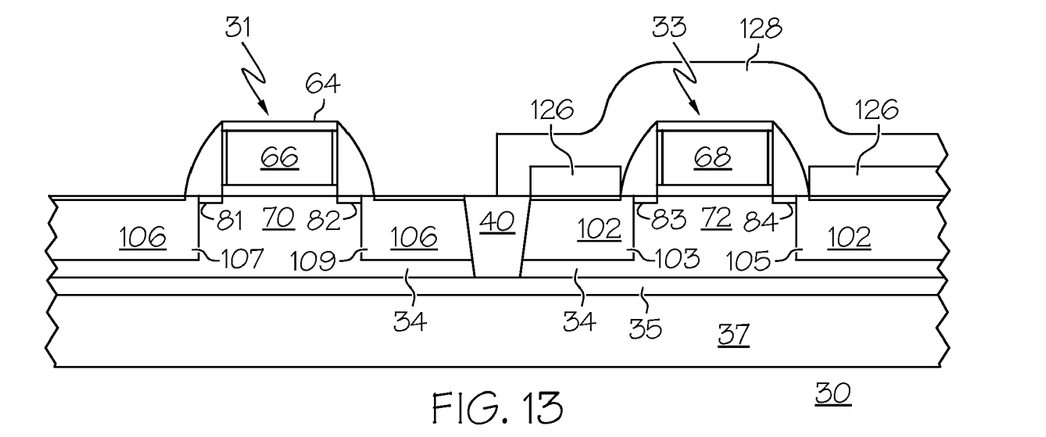

Patterned insulating layer 124 is removed and another insulating layer 128 is deposited and patterned as illustrated in FIG. 13. Insulating layer 128 can be a material similar to the material of insulating layer 124. Insulating layer 128 is patterned and etched by conventional photoresist patterning and etching to remove the layer overlying NMOS transistor 31 and to retain the layer overlying PMOS transistor 33.

Figure 14:
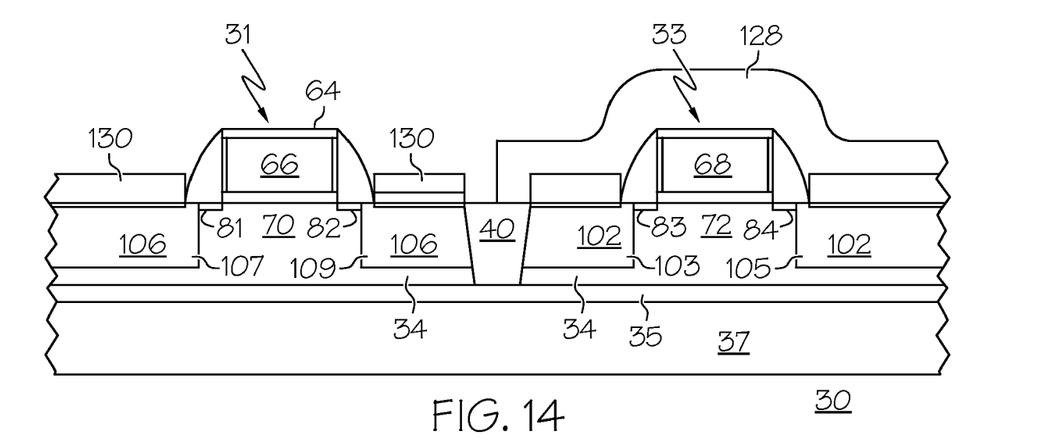

As illustrated in FIG. 14, the method in accordance with this embodiment continues by selectively depositing a layer of tensile stressed metal nitride 130 in electrical contact with thin metal silicide layer 112 overlying source region 107 and drain region 109 of NMOS transistor 33. The tensile stressed metal nitride can be selected from the same metal nitrides as are deposited on PMOS transistor 33. Stressed metal nitride 130 is preferably deposited by an electro-less deposition process. Again, the deposition conditions are adjusted to deposit the layer as a tensile stressed layer. After the selective deposition of metal nitride layer 130, patterned insulating layer 128 is removed. The formation of a tensile stressed metal nitride layer on the source and drain of NMOS transistor 31 and the formation of a compressive stressed metal nitride layer on the source and drain of PMOS transistor 33 increase the strain applied to the channels of those transistors and, in turn, enhance the mobility of the majority carriers in the transistor channels. Those of skill in the art will understand that the order of depositing metal nitride layers 126 and 130 can be reversed.

The method in accordance with this embodiment continues in the same manner as illustrated in FIGS. 9 and 10 with the exception that seed layer 114 is selectively deposited onto metal nitride layers 126 and 130 instead of directly onto thin metal silicide layer 112.

Figure 15:
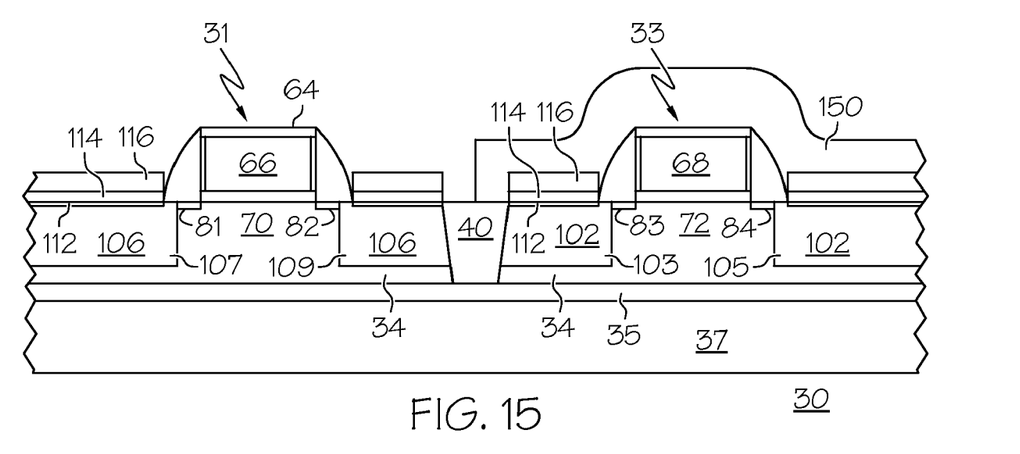
FIGS. 15 and 16, taken together with FIGS. 1-10 or FIGS. 1-14, illustrate, in cross section, a strain enhanced MOS device and methods for its fabrication in accordance with yet further embodiments.
Figure 16:
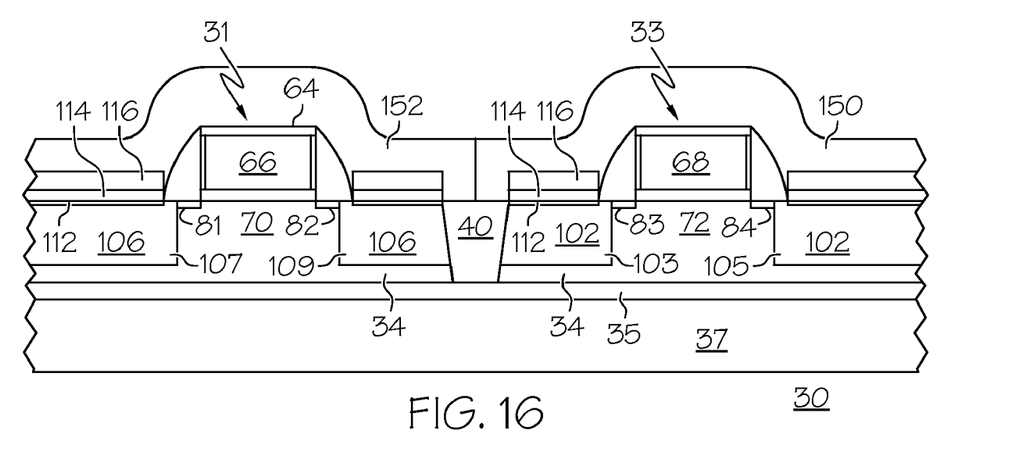

In accordance with yet another embodiment a dual stress liner is deposited overlying thicker deposited metal layer 116 and gate electrodes 66 and 68 as illustrated in FIGS. 15 and 16. Referring back to FIG. 10, whether the selectively deposited thicker conductive layer 116 is deposited on thin metal silicide layer 112 or on metal nitride layers 126 and 130, instead of depositing a conventional ILD layer, a layer of stressed insulating material 150, preferably a layer of stressed silicon nitride is deposited. In accordance with one embodiment layer 150 of stressed insulating material is a layer of compressive stressed silicon nitride. Layer 150 is patterned to remove the compressive stressed insulating material overlying NMOS transistor 31 and to retain the compressive stressed insulating material overlying PMOS transistor 33 as illustrated in FIG. 15.

The method in accordance with this embodiment continues, as illustrated in FIG. 16 by the deposition of another layer of stressed insulating material 152, this layer being a layer of tensile stressed insulating material and preferably a layer of tensile stressed silicon nitride. Layer 152 is patterned and etched to remove the portion of the layer overlying PMOS transistor 33 and to retain the portion of the layer overlying NMOS transistor 31. The layers of silicon nitride, both compressive stressed and tensile stressed, can be deposited, for example, by LPCVD or PECVD from reactants including dichlorosilane and ammonia. The deposition conditions, reactants, and reactant flows can be adjusted, as is well known, to deposit either a tensile stress liner or a compressive stress liner. The compressive stressed insulator liner overlying PMOS transistor 33 serves to increase the compressive longitudinal stress on channel 72 and to hence increase the mobility of majority carrier holes in that channel. The tensile stressed liner overlying NMOS transistor 31 serves to increase the tensile longitudinal stress on channel 70 and hence to increase the mobility of majority carrier electrons in that channel. The patterned layers of compressive and tensile stressed insulating layers can be overlaid by a layer of insulator such as a layer of silicon oxide and the device can be completed in the same manner as illustrated in FIG. 10.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method for manufacturing a strain enhanced semiconductor device comprising a semiconductor substrate, the semiconductor substrate having a surface and comprising source and drain regions formed therein that are separated by a channel region formed in the semiconductor substrate, and the semiconductor device further comprising a gate electrode overlying the surface and the channel region of the semiconductor substrate, the method comprising the steps of:

forming recesses in the semiconductor substrate;

epitaxially growing a strain inducing semiconductor material in the recesses to embed the strain inducing semiconductor material in the source and drain regions;

depositing a layer of silicide forming metal on substantially planar surfaces of the strain inducing semiconductor material that is embedded in the source and drain regions and heating to form thin metal silicide contacts directly along the substantially planar surfaces of the strain inducing semiconductor material that is embedded in the source and drain regions;

electro-lessly depositing a seed layer comprising palladium overlying the substantially planar surfaces of the strain inducing semiconductor material that is embedded in the source and drain regions, wherein the seed layer is in physical contact with the thin metal silicide contacts;

electro-lessly depositing a conductive layer comprising cobalt and tungsten overlying the seed layer;

then, without removing any of the conductive layer, depositing an insulating layer overlying the conductive layer;

etching contact openings through the insulating layer; and forming, in the contact openings, metallized contacts that physically contact the conductive layer.

2. The method of claim 1 further comprising a step of depositing a layer of stressed insulating material overlying the gate electrode.

3. The method of claim 2 wherein the step of depositing the layer of stressed insulating material comprises a step of depositing a layer of stressed silicon nitride.

4. The method of claim 1 wherein the semiconductor device comprises a PMOS transistor and wherein the step of epitaxially growing the strain inducing semiconductor material comprises the step of epitaxially growing silicon germanium in the recesses to embed the silicon germanium in the source and drain regions.

5. The method of claim 1 wherein the semiconductor device comprises an NMOS transistor and wherein the step of epitaxially growing the strain inducing semiconductor material comprises the step of epitaxially growing silicon carbide in the recesses to embed the silicon carbide in the source and drain regions.

6. The method of claim 1 wherein the step of depositing the layer of silicide forming metal, comprises:

depositing the layer of silicide forming metal on the substantially planar surfaces of the strain inducing semiconductor material that is embedded in the source and drain regions and on a surface of the gate electrode, and heating to form the thin metal silicide contacts directly along the substantially planar surfaces of the strain inducing semiconductor material that is embedded in the source and drain regions and to form a first thin metal silicide contact along the surface of the gate electrode.

7. The method of claim 6 wherein the step of depositing the insulating layer overlying the conductive layer, comprises:

depositing the insulating layer directly overlying and directly contacting the conductive layer and directly contacting the first thin metal silicide contact along the surface of the gate electrode.

8. The method of claim 1, wherein the step of forming, in the contact openings, the metallized contacts that physically contact the conductive layer, comprises:

forming, in the contact openings, the metallized contacts that extend through the insulating layer and that physically contact the conductive layer.

9. The method of claim 1, wherein the step of then, without removing any of the conductive layer, depositing the insulating layer overlying the conductive layer, comprises:

then, following the step of electro-lessly depositing the conductive layer and without removing any of the conductive layer, depositing the insulating layer directly overlying and directly contacting the conductive layer.

10. The method of claim 9, wherein the step of etching the contact openings through the insulating layer, comprises:
etching the contact openings through the insulating layer that extend to a surface of the conductive layer.

11. A method for manufacturing a strain enhanced semiconductor device comprising a semiconductor substrate, the semiconductor substrate having a surface and comprising source and drain regions formed therein that are separated by a channel region formed in the semiconductor substrate, and the semiconductor device further comprising a gate electrode overlying the surface and the channel region of the semiconductor substrate, the method comprising the steps of:
forming recesses in the semiconductor substrate;
epitaxially growing a strain inducing semiconductor material in the recesses to embed the strain inducing semiconductor material in the source and drain regions;
depositing a layer of silicide forming metal on substantially planar surfaces of the strain inducing semiconductor material that is embedded in the source and drain regions and on a surface of the gate electrode, and heating to form thin metal silicide contacts directly along the substantially planar surfaces of the strain inducing semiconductor material that is embedded in the source and drain regions and to form a first thin metal silicide contact along the surface of the gate electrode;
electro-lessly depositing a seed layer comprising palladium overlying the substantially planar surfaces of the strain inducing semiconductor material that is embedded in the source and drain regions, wherein the seed layer is in physical contact with the thin metal silicide contacts;
electro-lessly depositing a conductive layer comprising cobalt and tungsten overlying the seed layer;
then, following the step of electro-lessly depositing the conductive layer and without removing any of the conductive layer, depositing an insulating layer directly contacting the conductive layer and directly contacting the first thin metal silicide contact along the surface of the gate electrode;
etching contact openings through the insulating layer; and
forming, in the contact openings, metallized contacts that extend through the insulating layer and physically contact the conductive layer.

12. The method of claim 11, wherein the step of depositing the insulating layer comprises:
then, following the step of electro-lessly depositing the conductive layer and without removing any of the conductive layer, depositing the insulating layer directly overlying and directly contacting the conductive layer and directly contacting the first thin metal silicide contact along the surface of the gate electrode.

13. The method of claim 12, wherein the step of etching the contact openings through the insulating layer, comprises:
etching the contact openings through the insulating layer that extend to a surface of the conductive layer.

\* \* \* \* \*